(12) United States Patent
Bajaj et al.

(10) Patent No.: US 10,177,002 B2
(45) Date of Patent: Jan. 8, 2019

(54) METHODS FOR CHEMICAL ETCHING OF SILICON

(71) Applicant: APPLIED MATERIALS, INC., Santa Clara, CA (US)

(72) Inventors: Geetika Bajaj, New Delhi (IN); Ravindra Patil, Thane (IN); Prerna Goradia, Maharashtra (IN); Robert Jan Visser, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/459,536

(22) Filed: Mar. 15, 2017

(65) Prior Publication Data

US 2017/0316946 A1 Nov. 2, 2017

Related U.S. Application Data

(60) Provisional application No. 62/329,580, filed on Apr. 29, 2016.

(51) Int. Cl.

| H01L 21/322 | (2006.01) |
|---|---|
| H01L 21/3065 | (2006.01) |
| H01L 21/02 | (2006.01) |
| H01L 21/311 | (2006.01) |
| H01L 21/306 | (2006.01) |

(52) U.S. Cl.
CPC .... *H01L 21/3065* (2013.01); *H01L 21/02043* (2013.01); *H01L 21/31116* (2013.01); *H01L 21/322* (2013.01); *H01L 21/30621* (2013.01)

(58) Field of Classification Search
CPC ......... H01L 21/02043; H01L 21/31116; H01L 21/3086; H01L 21/3065; H01L 21/322; H01L 21/02433

USPC ....... 438/706, 710, 712, 714, 723, 725, 762, 438/765, 719; 216/67, 72, 73
See application file for complete search history.

(56) References Cited

U.S. PATENT DOCUMENTS

| 8,617,411 B2 | 12/2013 | Singh |
| 9,773,683 B2 * | 9/2017 | Gupta ............... H01L 21/32136 |
| 2006/0163200 A1 | 7/2006 | Sandhu et al. |
| 2009/0275205 A1 | 11/2009 | Kiehlbauch et al. |

(Continued)

FOREIGN PATENT DOCUMENTS

| EP | 0433983 A2 | 6/1991 |
| KR | 10-2009-0030702 A | 3/2009 |
| WO | WO 2012-052858 A1 | 4/2012 |

OTHER PUBLICATIONS

International Search Report and Written Opinion dated Sep. 11, 2017 for PCT Application No. PCT/US2017/029249.

*Primary Examiner* — Lan Vinh
(74) *Attorney, Agent, or Firm* — Moser Taboada; Alan Taboada

(57) ABSTRACT

Improved methods for chemically etching silicon are provided herein. In some embodiments, a method of etching a silicon material includes: (a) exposing the silicon material to a halogen-containing gas; (b) evacuating the halogen-containing gas from the semiconductor processing chamber; (c) exposing the silicon material to an amine vapor to etch a monolayer of the silicon material; (d) evacuating the amine vapor from the semiconductor processing chamber and; (e) optionally repeating (a)-(d) to etch the silicon material to a predetermined thickness.

20 Claims, 4 Drawing Sheets

(56) References Cited

U.S. PATENT DOCUMENTS

| | | | | |
|---|---|---|---|---|
| 2009/0286402 A1* | 11/2009 | Xia | .................... | H01L 21/0337 |
| | | | | 438/703 |
| 2014/0001145 A1 | 1/2014 | Mizutani et al. | | |
| 2015/0000695 A1* | 1/2015 | Noda | .................. | C23C 16/4405 |
| | | | | 134/1.1 |
| 2015/0214030 A1* | 7/2015 | Kirikihira | ......... | H01L 21/67109 |
| | | | | 438/778 |

* cited by examiner

METHODS FOR CHEMICAL ETCHING OF SILICON

CROSS-REFERENCE TO RELATED APPLICATIONS

This application claims the benefit of priority to U.S. patent application Ser. No. 62/329,580, filed Apr. 29, 2016, which is herein incorporated by reference in its entirety.

FIELD

Embodiments of the present disclosure generally relate to methods for chemically etching silicon.

BACKGROUND

Etching silicon in high aspect ratio features is performed in many semiconductor device manufacturing applications, such as fin trim and lateral recess formation. Plasma etching is a technique known in the art to perform precision etching in semiconductor device manufacturing. However, etching using plasma can result in damage or undesirable modification to underlying layers or structures. Preventing or reducing such damage becomes increasingly important as semiconductor device technology progresses to smaller technology nodes, for example, sub 45-nm nodes. Furthermore, etch selectivity is also important in semiconductor device manufacturing, such as with semiconductor field-effect transistors. Plasma etching typically relies on energetic ion bombardment to provide high etching rates, which makes obtaining etch selectivity difficult.

Accordingly, the inventors have developed improved methods for chemically etching silicon.

SUMMARY

Methods for chemically etching silicon are provided herein. In some embodiments, a method of etching a silicon material includes: (a) exposing the silicon material to a halogen-containing gas; (b) evacuating the halogen-containing gas from the semiconductor processing chamber; (c) exposing the silicon material to an amine vapor to etch at least one of a monolayer or a multi-layer of the silicon material; (d) evacuating the amine vapor from the semiconductor processing chamber; and (e) optionally repeating (a)-(d) to etch the silicon material to a predetermined thickness.

In some embodiments, a method of etching a silicon material on a substrate in a semiconductor processing chamber, includes: (a) removing a native oxide layer from a surface of the silicon material prior to exposing the silicon material to a halogen-containing gas, e.g., a chlorine-containing gas; (b) exposing the silicon material to the chlorine-containing gas for a first period of time; (c) evacuating the chlorine-containing gas from the semiconductor processing chamber; (d) purging the semiconductor processing chamber with an inert gas after evacuating the chlorine-containing gas from the semiconductor processing chamber; (e) exposing the silicon material to an amine vapor, e.g., a diethylamine vapor, for a second period of time to etch at least one of a monolayer or a multi-layer of the silicon material; (f) evacuating the amine vapor from the semiconductor processing chamber; (g) purging the semiconductor processing chamber with an inert gas after evacuating the amine vapor from the semiconductor processing chamber; and (h) optionally repeating (b)-(g) to etch the silicon material to a predetermined thickness.

In some embodiments, a non-transitory computer readable medium having instructions stored thereon that, when executed, cause a method for etching a silicon material on a substrate in a semiconductor processing chamber to be performed. The method may include any of the embodiments disclosed herein.

Other embodiments and variations of the present disclosure are discussed below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate only typical embodiments of the disclosure and are not to be considered limiting of the scope, for the disclosure may admit to other equally effective embodiments.

Figure 1:
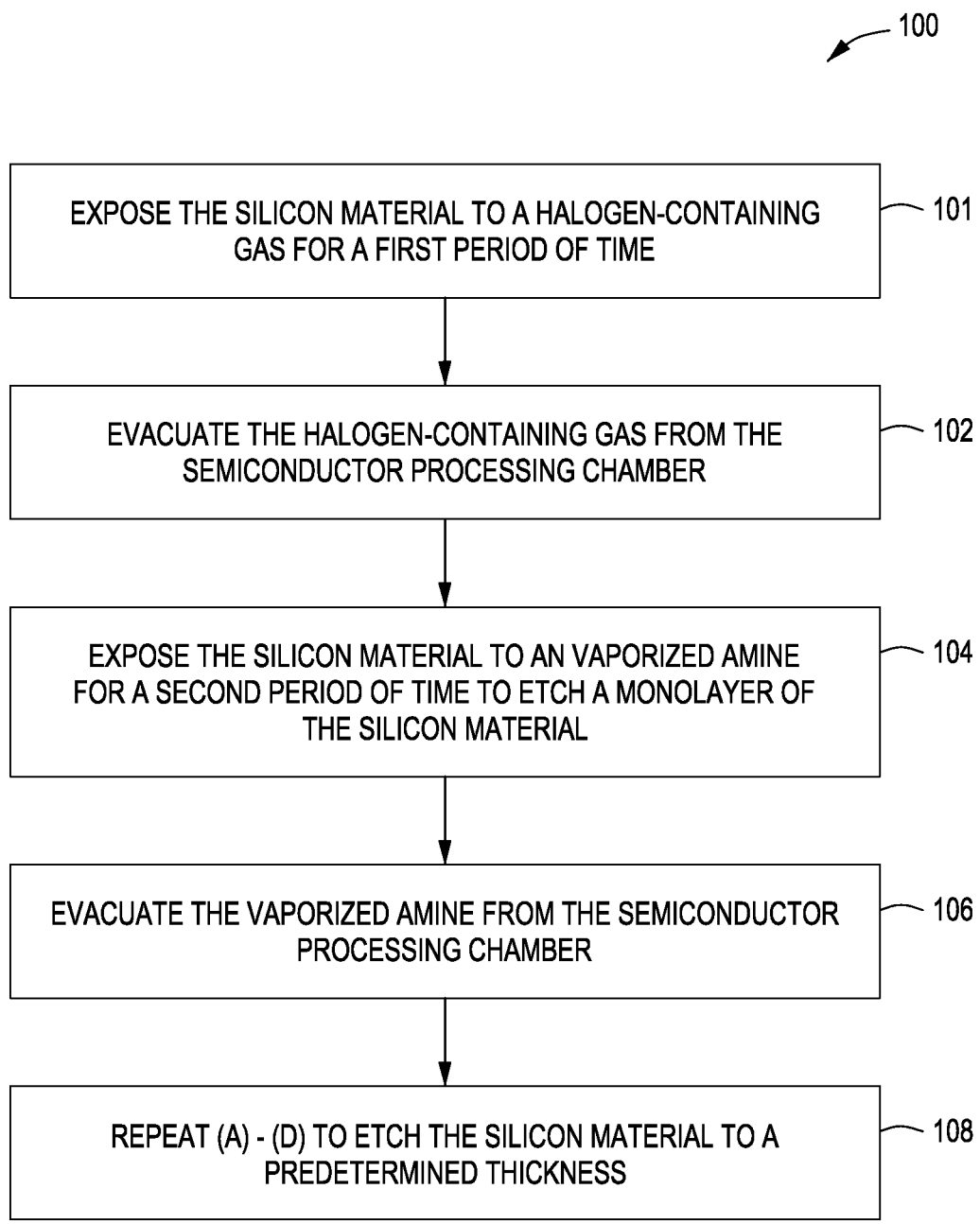
FIG. 1 depicts a flowchart of a method of etching a silicon material in accordance with some embodiments of the present disclosure.

To facilitate understanding, identical reference numerals have been used, where possible, to designate identical elements that are common to the figures. The figures are not drawn to scale and may be simplified for clarity. Any of the elements and features of any embodiment disclosed herein may be beneficially incorporated in other embodiments without further recitation.

DETAILED DESCRIPTION

Methods for etching a silicon material are provided herein. In some embodiments, the innovative methods described herein provide a method of chemically etching a silicon material that advantageously avoids the use of a plasma in order to prevent or reduce damage or undesirable modification to underlying layers or structures. In some embodiments, the innovative methods described herein also provide a method of chemically etching a silicon material that advantageously avoids the use of a plasma in order to selectively etch a silicon material over a silicon oxide material (e.g., $SiO_x$).

Figure 2A:
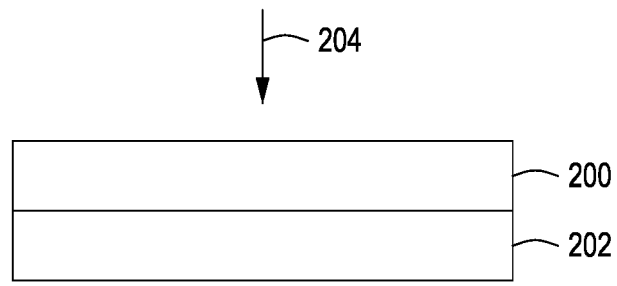
FIGS. 2A-2C depict the stages of etching a silicon material in accordance with some embodiments of the present disclosure.
Figure 2B:
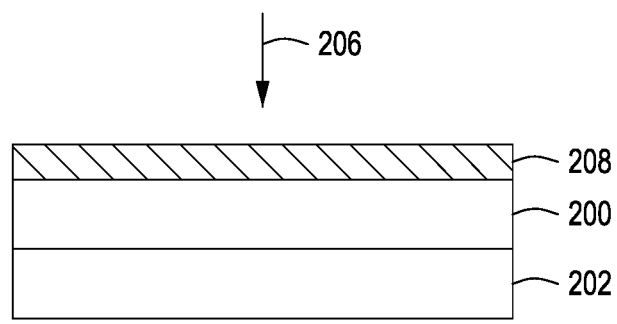
Figure 2C:
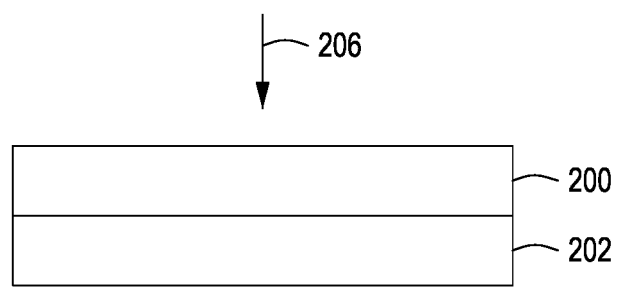

FIG. 1 is a flow diagram of a method 100 of etching a silicon material atop a substrate in accordance with some embodiments of the present disclosure. FIGS. 2A-2C are illustrative cross-sectional views of the substrate during different stages of the processing sequence of FIG. 1 in accordance with some embodiments of the present disclosure. The innovative methods may be performed in a suitable reactor vessel, such as the reactor vessel discussed below with respect to FIG. 3.

In some embodiments, the substrate may be optionally pre-cleaned prior to the process of etching the silicon material as described at method 100 below. By pre-cleaning the substrate prior to the etching process, contaminants from previously performed processes may be removed. In some embodiments, the pre-cleaning process may function to remove an oxide layer, for example, a native oxide layer, from a surface of the silicon material.

The pre-cleaning process may be any process suitable to facilitate removal of any material from the surface of the silicon material, for example, such as the oxide layer discussed above. Embodiments having a native oxide layer to be removed from the surface of the silicon material using the pre-cleaning process may comprise, for example, a SICONI™ pre-clean process performed in a suitable chamber, such as a process chamber that utilizes SICONI™ technology available from Applied Materials, Inc., of Santa Clara, Calif. In such embodiments, the substrate may be exposed to a fluorine containing precursor and a hydrogen containing precursor in a two part dry chemical cleaning process. In some embodiments, the fluorine containing precursor may comprise nitrogen trifluoride ($NF_3$), hydrogen fluoride (HF), diatomic fluorine ($F_2$), monatomic fluorine (F), fluorine-substituted hydrocarbons, combinations thereof, or the like. In some embodiments, the hydrogen containing precursors may comprise atomic hydrogen (H), diatomic hydrogen ($H_2$), ammonia ($NH_3$), hydrocarbons, incompletely halogen-substituted hydrocarbons, combinations thereof, or the like.

In some embodiments, the first part in the two part process may comprise using a remote plasma source to generate an etchant species (e.g., ammonium fluoride ($NH_4F$)) from the fluorine containing precursor (e.g., nitrogen trifluoride ($NF_3$)), and the hydrogen containing precursor (e.g., ammonia ($NH_3$)). By using a remote plasma source, damage to the substrate may be minimized. The etchant species are then introduced into the pre-clean chamber and condensed into a solid by-product on the substrate surface through a reaction with native oxide layer. The second part may then optionally comprise an in-situ anneal to decompose the by-product using convection and radiation heating. The by-product then sublimates and may be removed from the substrate surface via, for example, a flow of gas and pumped out of the pre-clean chamber.

The method 100 generally begins at 101, and as depicted in FIG. 2A, where the silicon material 200 is exposed to a halogen-containing gas 204. The silicon material 200 may be disposed atop a substrate 202. The substrate 202 may be any suitable substrate used in semiconductor device manufacturing, such as a semiconductor wafer. The substrate 202 may have multiple films or layers thereon, including one or more layers of silicon material 200. The substrate 202 may or may not be patterned. Examples of suitable silicon material 200 include without limitation amorphous silicon, polysilicon, or crystalline silicon.

The halogen-containing gas 204 is any suitable gas having a sufficient amount of halogen to result in halogen-termination of surfaces of the silicon material 200 that are exposed to the halogen-containing gas 204. In some embodiments, the halogen-containing gas is a chlorine-containing gas having a sufficient amount of chlorine to result in chlorine-termination of surfaces of the silicon material 200 that are exposed to the chlorine-containing gas. Examples of suitable chlorine-containing gases 204 include, without limitation, chlorine ($Cl_2$), hydrogen chloride (HCl), boron trichloride ($BCl_3$), and silicon tetrachloride ($SiCl_4$). In some embodiments, the halogen-containing gas is a bromine-containing gas. Examples of suitable bromine-containing gases are bromine ($Br_2$), hydrogen bromide (HBr), boron tribromide ($BBr_3$), bromotrichloromethane ($BrCCl_3$), and bromotrifluoromethane ($CF_3Br$). In some embodiments, the halogen-containing gas is a fluorine-containing gas. Examples of suitable fluorine-containing gases are fluorine ($F_2$), and hydrogen fluoride (HF). In some embodiments, the silicon material 200 can be exposed to a wet chemical treatment instead of a gaseous treatment. For example, the silicon material 200 can be exposed to a substantially saturated solution of phosphorous pentachloride ($PCl_5$) in chlorobenzene and/or other liquid solutions containing chlorine moieties. In some embodiments, the halogen-containing gas is a mixture of any of the foregoing chlorine-containing gases, bromine-containing gases, and/or fluorine-containing gases. Also, in some embodiments, the halogen-containing gas may be vaporized from an elemental liquid source or from a liquid solution in which a halogen-containing chemical has been dissolved.

The silicon material 200 is exposed to the halogen-containing gas 204 for a sufficient amount of time (e.g., a first period of time) to result in halogen-termination of surfaces of the silicon material 200 that are exposed to the halogen-containing gas 204, for example chlorine-termination of surfaces of the silicon material that are exposed to a chlorine-containing gas. In some embodiments, the silicon material 200 is exposed to the halogen-containing gas 204 for up to about 5 minutes. In some embodiments, the silicon material 200 is exposed to the halogen-containing gas 204 for up to about 3 minutes. In some embodiments, the silicon material 200 is exposed to the halogen-containing gas 204 for about 10 milliseconds to about 60 seconds. In some embodiments, during exposure of the silicon material 200 to the halogen-containing gas 204, the substrate 202 is at a temperature of greater than about 25 degrees Celsius, for example about 25 degrees Celsius to about 175 degrees Celsius. The substrate temperature is generally no higher than the decomposition temperature of the amine vapor selected at 104. In some embodiments, during exposure of the silicon material 200 to the halogen-containing gas 204, the pressure of the substrate processing chamber is up to about 500 millitorr. In some embodiments, during exposure of the silicon material 200 to the halogen-containing gas 204, the pressure of the substrate processing chamber is about 100 millitorr to about 10 torr.

Next, at 102, after the halogen-containing gas 204 has had sufficient time to adsorb onto the surface of the silicon material 200 and form a halogen-terminated silicon material surface, the halogen-containing gas 204 is evacuated from the process chamber. In some embodiments, after the halogen-containing gas 204 is evacuated from the process chamber, the process chamber is purged with an inert gas (i.e., a gas that will not react with the halogen-terminated silicon material surface). In some embodiments, the inert gas is, for example, argon (Ar), helium (He), or nitrogen ($N_2$).

Next, at 104, and as depicted in FIG. 2B, the silicon material 200 is exposed to an amine vapor 206. In some embodiments, exposure to the amine vapor 206 results in monolayer etching (i.e., removing one atomic layer) of the silicon material 200. In some embodiments, exposure to the amine vapor 206 results in multi-layer etching (i.e., removing a plurality of atomic layers) of the silicon material 200. Adjusting the process conditions (e.g., temperature, pressure) can lead to sub-monolayer or more than monolayer etching. In some embodiments, the amine vapor is any suitable amine that will dissociate at the exposed surface of the silicon material 200 and form a dative bond with the silicon. In some embodiments, the amine vapor is a primary amine having the formula $R1-NH_2$, where R1 can be an alkyl group such as methyl, ethyl, propyl, or butyl, and/or other alkyl groups or an aryl group such as phenyl, naphthyl, or thienyl and/or other aryl groups. Examples of suitable primary amines include, without limitation, methylamine, and/or the like. In some embodiments, the amine vapor is a secondary amine having the formula R1R2NH, where R1 and R2 can each be either an alkyl group or aryl group. Examples of suitable secondary amines include, without limitation, dimethylamine, N-methylpentylamine, and/or the like. In some embodiments, the amine vapor is a tertiary amine having the formula R1R2R3N, where R1 and R2 and can each be either an alkyl group or aryl group. For example, R1 can be an alkyl group, R2 an alkyl group, and R3 an aryl group, or any other permutation thereof. Examples of suitable tertiary amines include, without limitation, trimethylamine, triphenylamine, N,N-dimethylbutylamine, and/or the like. In some embodiments, the amine vapor is an aromatic amine having the nitrogen atom connected to an aromatic ring. Non-limiting examples of suitable aromatic amines include, without limitation, phenylamine, pyrrolidine, pyrroline, hexylamine, methylpyrrolidine and/or the like.

The reaction of the amine vapor 206 and the halogen-terminated surface of the silicon material 200 form a volatile compound 208 which desorbs from the surface of the silicon material 200. During exposure of the silicon material 200 to the amine vapor 206, the temperature of the substrate 202 is dependent on the decomposition temperature of the specific amine used in the process, i.e., at or near the decomposition temperature of the amine or lower. Also, the decomposition temperature for different amine vapors will vary and are within the scope of embodiments described herein. For example, the decomposition temperature for many amine vapors will be in excess of 175 degrees Celsius. Furthermore, the substrate temperature for different amine vapors will vary and are within the scope of embodiments described herein. The temperature of the substrate is below the decomposition temperature of the specific amine used at 104. For example, in embodiments where the amine vapor 206 is diethylamine, having a decomposition temperature of about 150 to about 170 degrees Celsius, the temperature of the substrate is about 140 degrees Celsius. In some embodiments, the temperature of the substrate is about 60 degrees Celsius to about 150 degrees Celsius for diethylamine. The volatile compound 208 desorbs from the surface of the silicon material 200 at the temperature described above, accordingly, in some embodiments, a separate anneal process is unnecessary to desorb the volatile compound. In some embodiments, a separate anneal process may be performed to desorb the volatile compound. In some embodiments, the amine vapor 206 is produced by heating a liquid amine solution to at least the boiling point of the liquid amine solution. Optionally, a second annealing step may be employed to desorb any residual volatile compound 208. Also, a second annealing step is optionally at a temperature greater than decomposition temperature.

As depicted in FIG. 2C, the silicon material 200 is exposed to the amine vapor 206 for a sufficient amount of time (e.g., an optional, second period of time) to result in at least one of monolayer etching or multi-layer etching of the silicon material 200. In some embodiments, the silicon material 200 is exposed to the amine vapor 206 for up to about 5 minutes, for example about 30 to about 60 seconds, or for example about 10 msec to about 600 seconds. In some embodiments, during exposure of the silicon material 200 to the amine vapor 206, the pressure of the substrate processing chamber is about 100 mtorr to about 10 torr.

Next, at 106, after the silicon material 200 is exposed to the amine vapor 206 for a sufficient amount of time to result in at least one of monolayer etching or multi-layer etching of the silicon material 200, the substrate processing chamber is evacuated and/or purged with an inert gas, such as argon (Ar) or helium (He).

Next, at 108, the method 100 can be repeated to etch the silicon material 200 to a predetermined thickness. As used herein, the etch rate may indicate etching of an atomic layer or close to an atomic layer, i.e., monolayer etching. The etch rate may also comprise a multilayer etch rate, i.e., removal of a plurality of atomic layers.

Figure 4A:
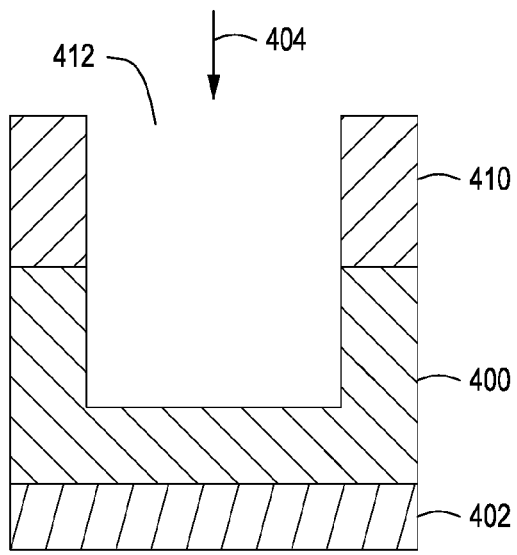
FIGS. 4A-4C, depict the stages of selectively etching silicon material over silicon dioxide material in accordance with some embodiments of the present disclosure.
Figure 4B:
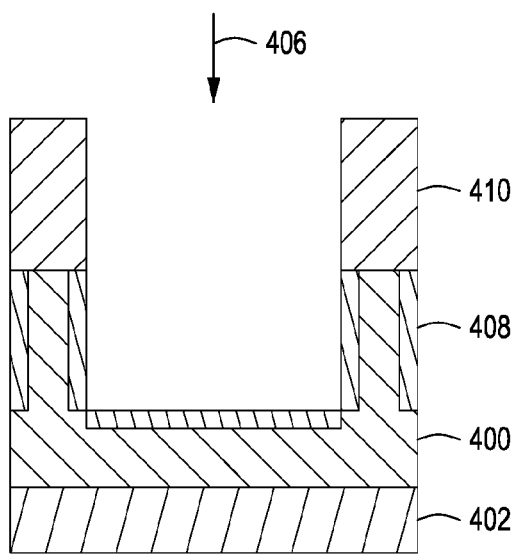
Figure 4C:
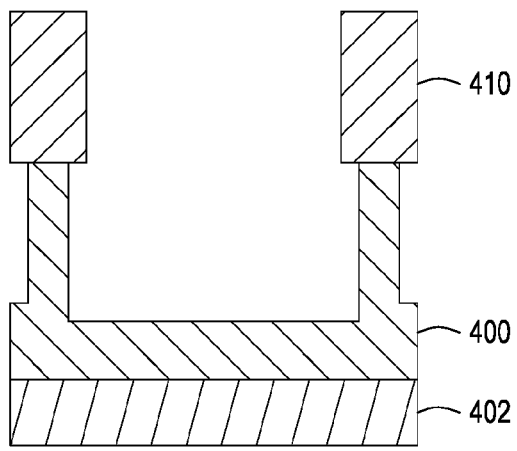

In some embodiments, as depicted in FIGS. 4A-4C, method 100 can be used to selectively etch silicon material over silicon dioxide material. The term "selectively" refers to the ratio of the etch rate of one material to the etch rate of another material. The term "selective etch" or "selectively etch" means to etch one material more than another material, for example, to selectively etch the silicon material, or in other words to have a greater or less than 1:1 etch selectivity between two materials. As depicted in FIG. 4A, a silicon material 400 is disposed atop a substrate 402. A silicon oxide material 410 is disposed atop the silicon material 400.

The silicon oxide material 410 may function as a mask layer, such as a hard mask or photoresist layer, to etch an opening 412 into the silicon material 400 as described below. The silicon oxide material 410 may be patterned to form a patterned mask layer. The patterned mask layer may be formed by any process suitable to form a patterned mask layer capable of providing an adequate template for defining a pattern in the underlying material. For example, in some embodiments, the patterned mask layer may be formed via a patterned etch process.

The opening 412 may be etched via any etching process suitable for etching an oxide material to form an opening 412 having vertical or substantially vertical sidewalls. For example, the substrate may be exposed to an etching plasma formed using a halogen containing gas, for example, a fluorine-containing gas. In some embodiments, the fluorine containing gas includes a fluorocarbon ($C_xF_y$) or a hydrofluorcarbon ($C_xH_yF_z$), for example tetrafluoromethane (CEO), hexafluoroethane ($C_2F_6$), fluoromethane ($CH_3F$), difluoromethane ($CH_2F_2$), methyl trifluoride ($CHF_3$), hexafluorobutadiene ($C_4F_6$), and octafluorocyclobutane ($C_4F_8$) or the like.

Once the initial opening 412 is formed, the silicon material 400 may be laterally etched using the method 100. As described in method 100 above and depicted in FIGS. 4A-4C, the silicon material 400 is exposed to a chlorine-containing gas 204 and then exposed to an amine vapor 406. The method 100 selectively etches the silicon material 408 over the oxide material. In some embodiments, etch selectivity of the silicon material 408 over the oxide material is about 100:1.

Figure 3:
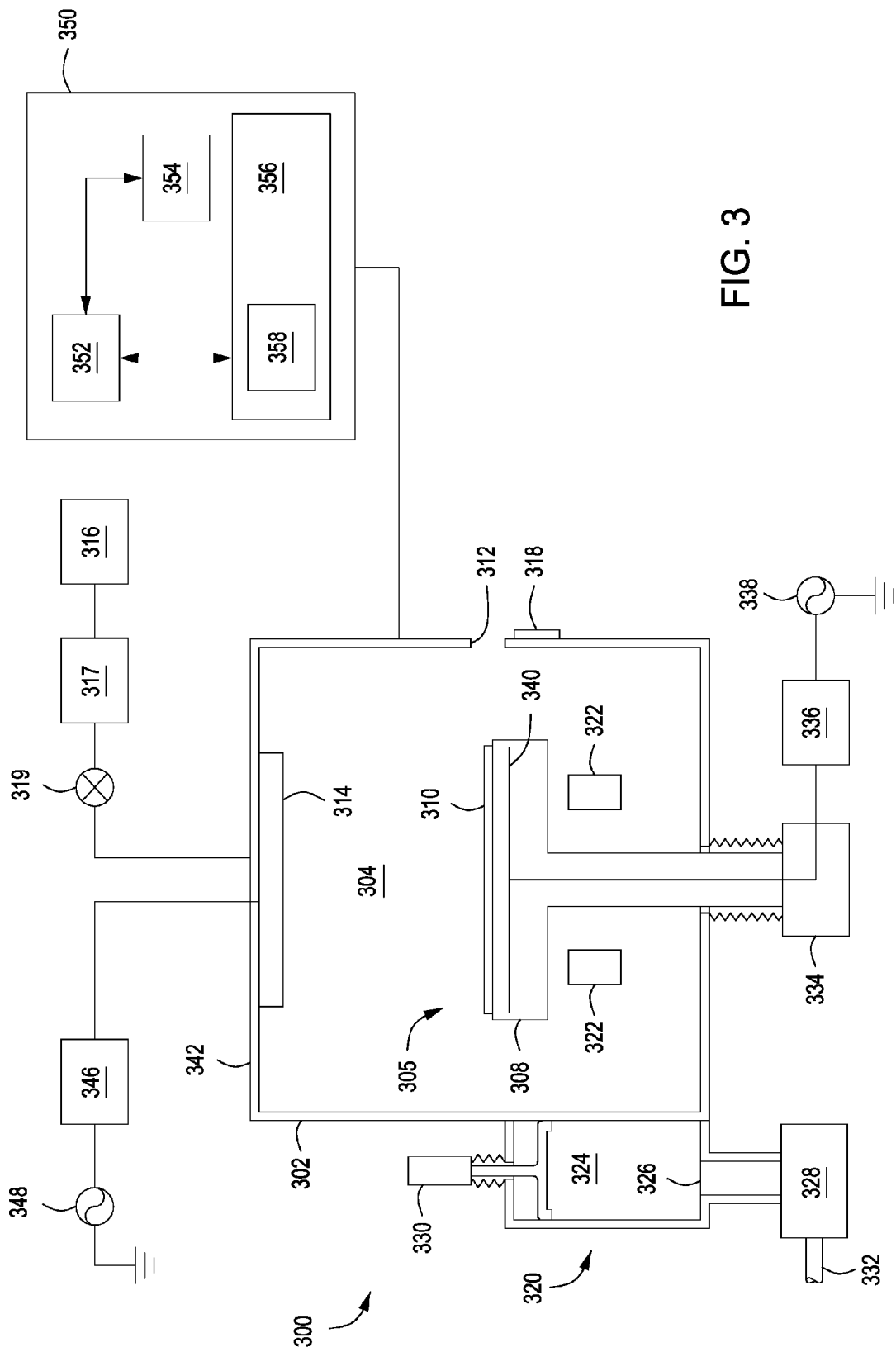
FIG. 3 depicts a cross-sectional view of an apparatus suitable to perform methods for etching a silicon material in accordance with some embodiments of the present disclosure.

FIG. 3 described below depicts an apparatus 300 suitable for processing a substrate in accordance with some embodiments of the present disclosure. The apparatus 300 may comprise a controller 350 and a process chamber 302 having an exhaust system 320 for removing excess process gases, processing by-products, or the like, from the interior of the process chamber 302. Exemplary process chambers may include the DPS®, ENABLER®, ADVANTEDGE™, AVATAR™, or other process chambers, available from Applied Materials, Inc. of Santa Clara, Calif. Other suitable process chambers may similarly be used.

The process chamber 302 has an inner volume 305 that may include a processing volume 304. The processing volume 304 may be defined, for example, between a substrate support pedestal 308 disposed within the process chamber 302 for supporting a substrate 310 during processing, and one or more gas inlets, such as a showerhead 314 and/or nozzles provided at predetermined locations. In some embodiments, the substrate support pedestal 308 may include a feature that retains or supports the substrate 310 on the surface of the substrate support pedestal 308, such as an electrostatic chuck, a vacuum chuck, a substrate retaining clamp, or the like (not shown). In some embodiments, the substrate support pedestal 308 may include features for controlling the substrate temperature (such as heating and/or cooling devices, not shown) and/or for controlling the species flux and/or ion energy proximate the substrate surface.

The substrate support pedestal 308 may include an RF bias electrode 340. The RF bias electrode 340 may be coupled to one or more RF bias power sources (RF power source 338 shown in FIG. 3) through one or more respective waveform adjusters (a first bias waveform adjuster 336 shown). The process chamber 302 may have a ceiling 342 made from dielectric materials and a showerhead 314 that is at least partially conductive to provide an RF electrode or a separate RF electrode may be provided. The showerhead 314 (or other RF electrode) may be coupled to one or more RF power sources (RF power source 348 shown) through one or more respective waveform adjusters (a first source waveform adjuster 346 shown).

The substrate 310 may enter the process chamber 302 via an opening 312 in a wall of the process chamber 302. The opening 312 may be selectively sealed via a slit valve 318, or other structure for selectively providing access to the interior of the chamber through the opening 312. The substrate support pedestal 308 may be coupled to a lift 334 that may control the position of the substrate support pedestal 308 between a lower position (as shown) suitable for transferring substrates into and out of the chamber via the opening 312 and a selectable upper position suitable for processing.

The one or more gas inlets (e.g., the showerhead 314) may be coupled to a gas supply 316 for providing one or more process gases through a mass flow controller 317 into the processing volume 304 of the process chamber 302. In addition, one or more valves 319 may be provided to control the flow of the one or more process gases. The mass flow controller 317 and one or more valves 319 may be used individually, or in conjunction to provide the process gases at predetermined flow rates at a constant flow rate, or pulsed (as described above).

Although a showerhead 314 is shown in FIG. 3, additional or alternative gas inlets may be provided such as nozzles or inlets disposed in the ceiling or on the sidewalls of the process chamber 302 or at other locations suitable for providing gases to the process chamber 302, such as the base of the process chamber, the periphery of the substrate support pedestal, or the like.

The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown). The vacuum pump 328 may be fluidly coupled to an exhaust outlet 332 for routing the exhaust to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The innovative methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the methods of the present disclosure may also be performed in hardware. As such, the disclosure may be implemented in software and executed using a computer system, in hardware as, e.g., an application specific integrated circuit or other type of hardware implementation, or as a combination of software and hardware. The software routine 358 may be executed after the substrate 310 is positioned on the substrate support pedestal 308. The software routine 358, when executed by the CPU 352, transforms the general purpose computer into a specific purpose computer, wherein the controller 350 controls the chamber operation such that the methods disclosed herein are performed.

While the foregoing is directed to embodiments of the present disclosure, other and further embodiments of the disclosure may be devised without departing from the basic scope thereof.

The invention claimed is:

1. A method of etching a silicon material on a substrate in a semiconductor processing chamber, comprising:
   (a) exposing the silicon material to a halogen-containing gas in a non-plasma state for a first period of time;
   (b) evacuating the halogen-containing gas from the semiconductor processing chamber;
   (c) subsequently, exposing the silicon material to an amine vapor in a non-plasma state for a second period of time to etch a monolayer of the silicon material;
   (d) evacuating the amine vapor from the semiconductor processing chamber; and
   (e) optionally repeating (a)-(d) to etch the silicon material to a predetermined thickness.

2. The method of claim 1, wherein the halogen-containing gas is at least of a chlorine-containing gas, a bromine-containing gas and/or a fluorine-containing gas.

3. The method of claim 1, wherein the amine vapor is a primary amine, a secondary amine, a tertiary amine, or an aromatic amine.

4. The method of claim 1, further comprising removing a native oxide layer from a surface of the silicon material prior to exposing the silicon material to the halogen-containing gas.

5. The method of claim 1, wherein the first period of time is up to about 5 minutes.

6. The method of claim 1, wherein a temperature of the substrate during exposure of the silicon material to the halogen-containing gas is about 25 degrees Celsius to about a decomposition temperature of the amine vapor.

7. The method of claim 1, wherein a pressure of the semiconductor processing chamber during exposure of the silicon material to the halogen-containing gas is about 100 mtorr to about 10 torr.

8. The method of claim 1, further comprising purging the semiconductor processing chamber with an inert gas after evacuating the halogen-containing gas from the semiconductor processing chamber.

9. The method of claim 1, wherein the second period of time is about 10 ms to about 600 seconds.

10. The method of claim 1, wherein a temperature of the substrate during exposure of the silicon material to the amine vapor is about 60 degrees Celsius to about a decomposition temperature of the amine vapor.

11. The method of claim 1, wherein a pressure of the semiconductor processing chamber during exposure of the silicon material to the amine vapor is about 100 mtorr to about 10 torr.

12. The method of claim 1, further comprising purging the semiconductor processing chamber with an inert gas after evacuating the amine vapor from the semiconductor processing chamber.

13. The method of claim 1, further comprising a patterned silicon oxide material disposed atop the silicon material, wherein (a)-(e) selectively etches the silicon material over the patterned silicon oxide material.

14. A method of etching a silicon material on a substrate in a semiconductor processing chamber, comprising:
 (a) removing a native oxide layer from a surface of the silicon material;
 (b) exposing the silicon material to a chlorine-containing gas in a non-plasma state for a first period of time;
 (c) evacuating the chlorine-containing gas from the semiconductor processing chamber;
 (d) purging the semiconductor processing chamber with an inert gas after evacuating the chlorine-containing gas from the semiconductor processing chamber;
 (e) subsequently, exposing the silicon material to a diethylamine vapor in a non-plasma state for a second period of time to etch a monolayer of the silicon material;
 (f) evacuating the diethylamine vapor from the semiconductor processing chamber;
 (g) purging the semiconductor processing chamber with an inert gas after evacuating the diethylamine vapor from the semiconductor processing chamber; and
 (h) optionally repeating (b)-(g) to etch the silicon material to a predetermined thickness.

15. The method of claim 14, wherein the first period of time is up to about 5 minutes.

16. The method of claim 14, wherein a temperature of the substrate during exposure of the silicon material to the chlorine-containing gas is about 25 degrees Celsius to about a decomposition temperature of the diethylamine vapor.

17. The method of claim 14, wherein the second period of time is about 10 msec to about 600 seconds.

18. The method of claim 14, wherein a temperature of the substrate during exposure of the silicon material to the diethylamine vapor is about 60 degrees Celsius to about 150 degrees Celsius.

19. The method of claim 14, further comprising a patterned silicon oxide material disposed atop the silicon material, wherein (b)-(h) selectively etches the silicon material over the patterned silicon oxide material.

20. A non-transitory computer readable medium having instructions stored thereon that, when executed, cause a method for etching a silicon material on a substrate in a semiconductor processing chamber, the method comprising:
 (a) exposing the silicon material to a halogen-containing gas in a non-plasma state for a first period of time;
 (b) evacuating the halogen-containing gas from the semiconductor processing chamber;
 (c) subsequently, exposing the silicon material to an amine vapor in a non-plasma state for a second period of time to etch a monolayer of the silicon material;
 (d) evacuating the amine vapor from the semiconductor processing chamber; and
 (e) optionally repeating (a)-(d) to etch the silicon material to a predetermined thickness.

* * * * *

UNITED STATES PATENT AND TRADEMARK OFFICE
CERTIFICATE OF CORRECTION

PATENT NO. : 10,177,002 B2
APPLICATION NO. : 15/459536
DATED : January 8, 2019
INVENTOR(S) : Geetika Bajaj et al.

It is certified that error appears in the above-identified patent and that said Letters Patent is hereby corrected as shown below:

In the Specification

In Column 6, Line 41 delete "tetrafluoromethane (CEO" and substitute therefor --tetrafluoromethane $(CF_4)$--.

Signed and Sealed this
Ninth Day of April, 2019

Andrei Iancu
*Director of the United States Patent and Trademark Office*